(12) United States Patent
Ueno

(10) Patent No.: US 6,472,318 B2
(45) Date of Patent: Oct. 29, 2002

(54) METHOD OF FABRICATING SEMICONDUCTOR DEVICE HAVING TRENCH INTERCONNECTION

(75) Inventor: Kazuyoshi Ueno, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/921,050

(22) Filed: Aug. 2, 2001

(65) Prior Publication Data
US 2002/0027292 A1 Mar. 7, 2002

Related U.S. Application Data

(62) Division of application No. 09/008,939, filed on Jan. 20, 1998, now abandoned.

(30) Foreign Application Priority Data

Jan. 20, 1997 (JP) ............................................. 9-007644

(51) Int. Cl.⁷ ............................................. H01L 21/302
(52) U.S. Cl. ....................... 438/653; 438/618; 438/637; 438/675; 438/700
(58) Field of Search ................................. 257/758, 763, 257/775, 774, 751, 757, 764, 770; 438/653

(56) References Cited

U.S. PATENT DOCUMENTS 5,903,053 A * 5/1999 Iijima et al. ................. 257/751
5,907,188 A * 5/1999 Nakajima et al. ........... 257/751
6,130,482 A * 10/2000 Iio et al. ...................... 257/774

* cited by examiner

Primary Examiner—David Nelms
Assistant Examiner—Dung Auh Le
(74) Attorney, Agent, or Firm—Hayes Soloway PC

(57) ABSTRACT

A semiconductor device having a trench interconnection is formed by providing a semiconductor substrate with an insulating film formed thereon. A trench is formed in the insulating film, and an amorphous phase barrier film of $WSi_xN_y$ or $WC_xN_y$ in an amorphous phase is formed.

14 Claims, 6 Drawing Sheets

METHOD OF FABRICATING SEMICONDUCTOR DEVICE HAVING TRENCH INTERCONNECTION

This Application is a Divisional of U.S. application Ser. No. 09/008,939 filed Jan. 20, 1998, now abandoned.

BACKGROUND OF THE INVENTION

1. Field of the Invention

The present invention relates to a semiconductor device having a trench interconnection to prevent diffusion of ions and the like between layers and a method of forming a barrier film for a semiconductor device. More particularly, the present invention relates to a barrier film capable of preventing increase in an interconnect resistance caused by heat treatment in the course of fabrication of the device.

2. Description of the Related Art

Recently, a trend of higher integration of elements in a semiconductor device has been advanced in accordance with miniaturization of its size. Accordingly, in a conventional semiconductor device, a size of a contact hole and a line width in interconnection have been smaller, but an aspect ratio (a quotient of a height or depth divided by a width) has been larger, since a dimension in a direction of the thickness of a substrate has not been smaller. In the case of 256 Mb DRAM, an aspect ratio of a contact hole is 4 or more. As for a method of forming interconnection, a damascene method has been used in many cases. The damascene method is to form a trench in an insulating film, and thereafter to fabricate an interconnect by filling the trench with a metal, and the method draws keen attention as a method of fabricating a copper interconnect, which has difficulty in fine etching.

Conventionally, as fabricating method of barrier films for a contact hole and a trench, it has been common to deposit a TiN film by means of a sputtering method. When an aspect ratio is larger, however, a film cannot be deposited on the side and bottom surfaces of the contact hole or the trench even with employment of a sputtering method. Therefore, a chemical vapor deposition method (CVD method) has recently come to be employed.

A method of fabricating a metal compound thin film, such as a $WN_x$ film and a $WSi_x$ film is disclosed in, for example, Publication of Unexamined Japanese Patent Application No. Sho 63-317676. In the publication, it is described that the $WN_x$ film has a non-granular structure. A method of fabricating a semiconductor device has the step of forming a $WN_x$ film by giving a nitrogen plasma treatment on a substrate in the course of deposition of a tungsten film. These are methods of fabricating $WN_x$ film better as a barrier than a W film.

As described above, a conventional $WN_x$ film has an advantage that the $WN_x$ film exhibits better performance as a barrier than the W film. However, it is well known that the $WN_x$ film is crystallized from its original amorphous structure at about 700° C. and nitrogen is dissociated from W in a bond of W—N at 850° C. Therefore, if the $WN_x$ film is employed as a barrier film, a property as a barrier may be deteriorated through a structural change of the film, depending on fabrication conditions of a semiconductor device.

A method of fabricating a W film on a substrate with ease is disclosed in Publication of Unexamined Japanese Patent Application No. Hei 6-291067. FIG. 1 is a typical view showing a conventional apparatus of fabricating a W film. In FIG. 1, a substrate holder 2 is disposed in a CVD chamber 1 and an electrode 26 is arranged above the substrate holder 2. The substrate holder 2 and electrode 26 are connected with a high frequency electric source 27 placed outside the CVD chamber 1. A gas in the CVD chamber 1 is discharged by a pump 4 through a discharge port 1a. Gas supply ports 1b, 1c are provided to the CVD chamber 1 and the gas supply port 1b is connected with a $WF_6$ gas bomb 5 through a mass flow controller 8 and the gas supply port 1c is connected with a nitrogen gas bomb 21 through a mass flow controller 8.

In the case where a W film is formed on a substrate with use of the CVD apparatus as constructed in such a manner, after a substrate 3 is placed on the substrate holder 2, the CVD chamber 1 is evacuated by means of the pump 4. Then, a nitrogen gas and a $WF_6$ gas are supplied into the CVD chamber 1, while flow rates are controlled by the mass flow controller 8 and simultaneously, a voltage is applied between the electrode 26 and substrate holder 2 by means of the high frequency electric source 27. In this condition, a plasma 28 is produced between the substrate 3 and the electrode 26, and the surface of the substrate 3 is charged by free electrons in the plasma. The free electrons work as a catalyst to form a W film on the substrate 3.

With use of a method shown in FIG. 1, since a plasma CVD method is adopted, a reaction in a gas phase becomes active and a W film can be formed on the substrate with no use of $SiH_4$ gas.

However, in the case where the above mentioned plasma CVD method is used to form a W film, products produced in a gas phase are deposited on the periphery of a substrate and thus in general a coverability of a W film on the substrate is reduced and it becomes hard to deposit a barrier film on the inner surfaces of a contact hole and a trench with high aspect ratios in a uniform manner, as in the case of employment of a sputtering method.

When a barrier film is formed, the barrier having a higher resistivity, compared with a W film, a Cu film or the like as interconnection, there arises a problem that a interconnect resistance is increased, since cross-sectional areas of a contact hole and an interconnect are decreased if a thickness of the barrier film is thick. For example, a device having a size of 0.25 μm or less requires that a thickness of a film is about 20 nm or less. Therefore, there is a demand for proposal for a semiconductor device having a trench interconnection and a method of forming a barrier film for a semiconductor device and fabricating method thereof, not only thinner compared with a conventional practice, but also better in coverability.

SUMMARY OF THE INVENTION

It is an object of the present invention to provide a semiconductor device having a trench interconnection and method of forming a barrier film with a thin thickness inside a fine contact hole, a fine interconnect trench or the like, thereby increase in a resistance of interconnects formed inside the contact hole or the interconnect trench can prevented and the barrier film has a high-temperature stability.

A semiconductor device having a trench interconnection according to the present invention comprises a semiconductor substrate, an insulating film having a trench formed on the substrate, a barrier film formed on an inner surface of the trench and a conductive material filled into the trench to form an interconnect line. The barrier film is made of material of one kind selected from the group consisting of $WSi_xN_y$ and $WC_xN_y$.

A depth of the trench may be smaller than a thickness of the insulating film or so large as to reach the substrate. The conductive material can be Cu, and a Ti film may be formed between the insulating film and the barrier film.

A method of fabricating a semiconductor device according to the present invention comprises the step of forming a barrier film made of material of one kind selected from the group consisting of $WSi_xN_y$ and $WC_xN_y$ on a semiconductor substrate by causing a reaction among a raw material gas containing W, one kind of gas selected from the group consisting of silane, dichlorosilane and a hydrocarbon gas, and a nitrogen supply source.

The nitrogen supply source can be at least one kind selected from the group consisting of a nitriding plasma, a $NH_3$ plasma, nitrogen gas, $NH_3$ gas, hydrazine and dimethyl hydrazine. The hydrocarbon gas can be a gas of one kind selected from the group consisting of methane gas, ethane gas and propane gas. The gas containing W can be a gas of one kind selected from the group consisting of $WF_6$ gas, $W(N(CH_3)_2)_6$ and $W(N(C_2H_5)_2)_6$.

A method of fabricating a semiconductor device according to the present invention may further comprise the steps of forming an insulating film on the semiconductor substrate and subsequently forming a trench in the insulating film. The trench has an inner surface where the barrier film should be formed.

Next, a conductive material is used to fill in the trench after the step of forming the barrier film on the inner surface of the trench. A step of filling the trench with a conductive material may be inserted after the step of forming the barrier film.

The nitrogen supply source can be a plasma of one kind selected from the group consisting a nitrogen plasma and an ammonia plasma, and the step of forming the barrier film has the steps of producing the nitrogen supply source and supplying the nitrogen supply source to the surface of the substrate.

Another method of fabricating a semiconductor device comprises the step of causing a reaction between a raw material gas of one kind selected from the group consisting of $W(N(CH_3))_6$ and $W(N(C_2H_5))_6$ and a gas of one kind selected from the group consisting of $SiH_4$ and $SiH_4$ to form a barrier film made of material of one kind selected from the group of $WSi_xN_y$ and $WC_xN_y$.

In the present invention, a barrier film made of $WSi_xN_y$ or $WC_xN_y$ is formed between either the insulating film and conductive material or the substrate and conductive material. Since crystallization of these films is disturbed in the presence of Si or C, they are more stable even in a high temperature range equal to or higher than 700° C., compared with a conventional barrier film made of $WN_x$. Therefore, even if a heat treatment at a temperature of 700° C. or higher is performed after formation of the barrier film; no diffusion arises and thus a property as a good barrier can be maintained, so that a semiconductor device having good characteristics can be obtained.

If a barrier film is formed on the substrate under a condition that a reaction of raw materials in a vapor phase, which is a cause for deterioration in coverability, is suppressed and a surface reaction, wherein a reaction of $SiH_4$, $CH_4$ or the like is performed on the substrate, is a rate-determining process, the barrier film having an amorphous phase made of $WSi_xN_y$ or $WC_xN_y$ can be deposited with a good coverability.

Furthermore, if a step of producing a plasma and a step of supplying the plasma on the surface of a substrate are provided separately from each other, a reaction of a raw material in a gas phase is suppressed and thus a coverability is improved compared with that of a conventional CVD method.

As described above, in the present invention, since a thin film such as of a thickness of 20 nm or less can be formed with a good coverability, compared with a conventional plasma CVD or conventional sputtering method, for example, not only can copper interconnection be adopted, but transmission through interconnection can also be conducted at a high speed with other merits, which makes it possible to improve performances of LSI.

DETAILED DESCRIPTION OF THE PREFERRED EMBODIMENTS

Figure 1:
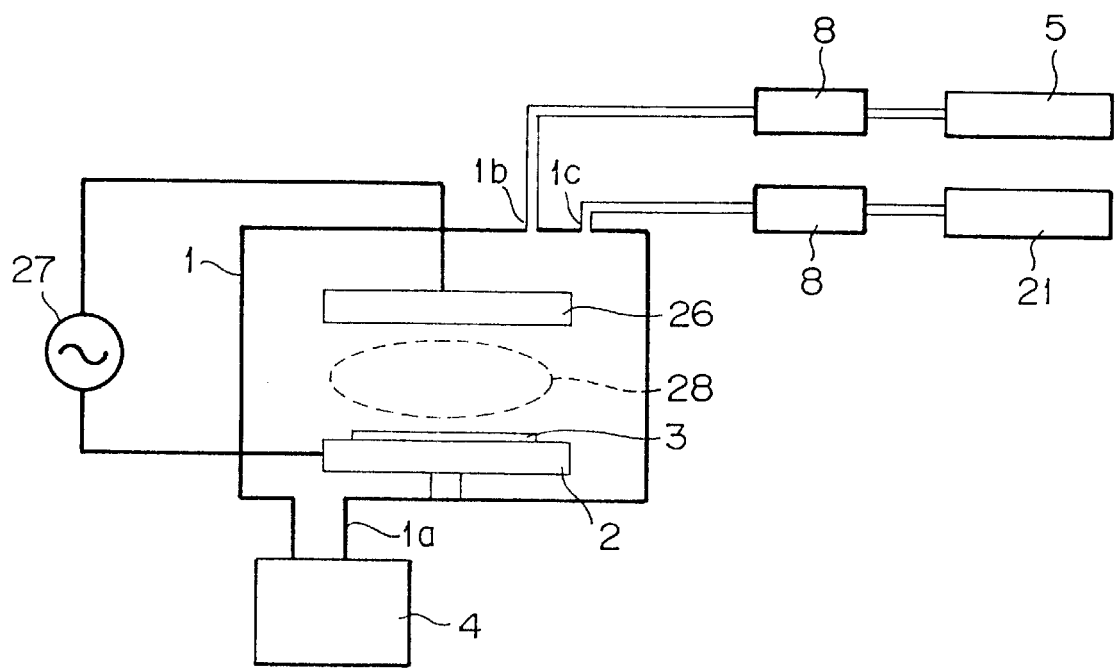
FIG. 1 is a typical view showing a conventional apparatus of fabricating a W film.
Figure 2A:
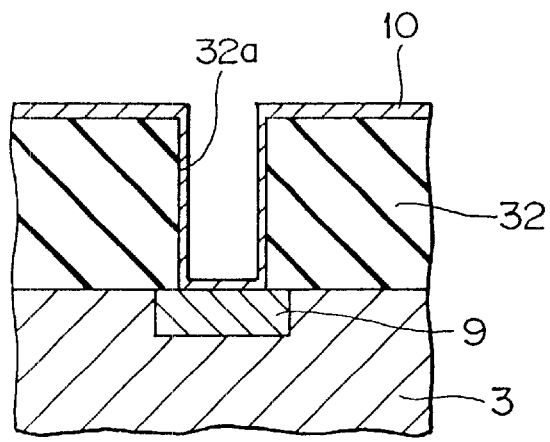
FIGS. 2A to 2C are cross-sectional views showing a method of fabricating a semiconductor device according to a first embodiment of the present invention in successive process steps.
Figure 2B:
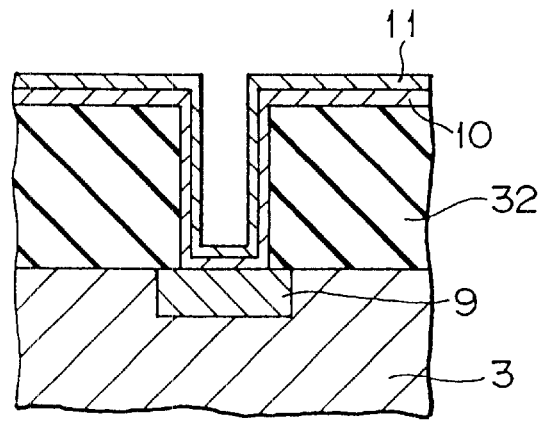
Figure 2C:
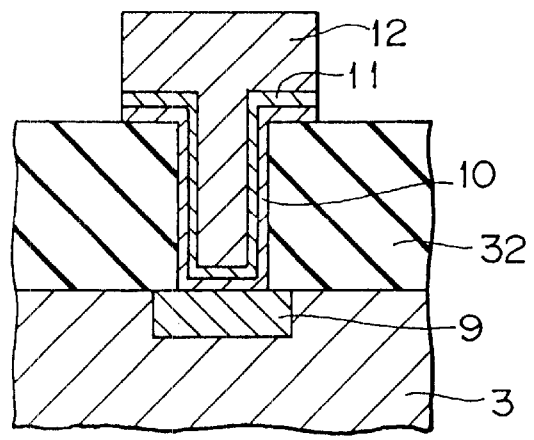

Descriptions on embodiments of the present invention will below be given in reference to the accompanying drawings in a detailed manner. FIGS. 2A to 2C are cross-sectional views showing a method of fabricating a semiconductor device according to a first embodiment of the present invention in successive process steps. As shown in FIG. 2A, an oxide film 32 is formed on an Si substrate 1, a through-hole 32a having a diameter of 0.3 μm is formed in the oxide film 32, the through-hole 32a extending from the surface of the oxide film 32 till reaching the surface of the substrate 3. An n-type Si diffused layer 9 is formed at the exposed surface of the substrate 3 exposed by formation of the through-hole 32a. The side wall surface and bottom surface of the through-hole 32a are covered by a deposited Ti film 10 as a contact metal. In the mean time, the Ti film 10 on the bottom surface of the through-hole 32a has a thickness of, for example, 10 nm.

As shown in FIG. 2B, a $WSi_xN_y$ film 11 is formed as a barrier film on the surface of the Ti film 10. At this point, a thickness of the $WSi_xN_y$ film 11 formed on the bottom surface of the through-hole 32a is set at, for example, 20 nm.

As shown in FIG. 2C, a Cu film 12 is deposited inside the through-hole 32a by CVD method and thereafter the film is processed for patterning of an interconnect. A structure is constructed in which the Cu film 12 is connected with the n-type Si diffused layer 9 by way of the $WSi_xN_y$ film 11 and the Ti film 10.

Figure 3:
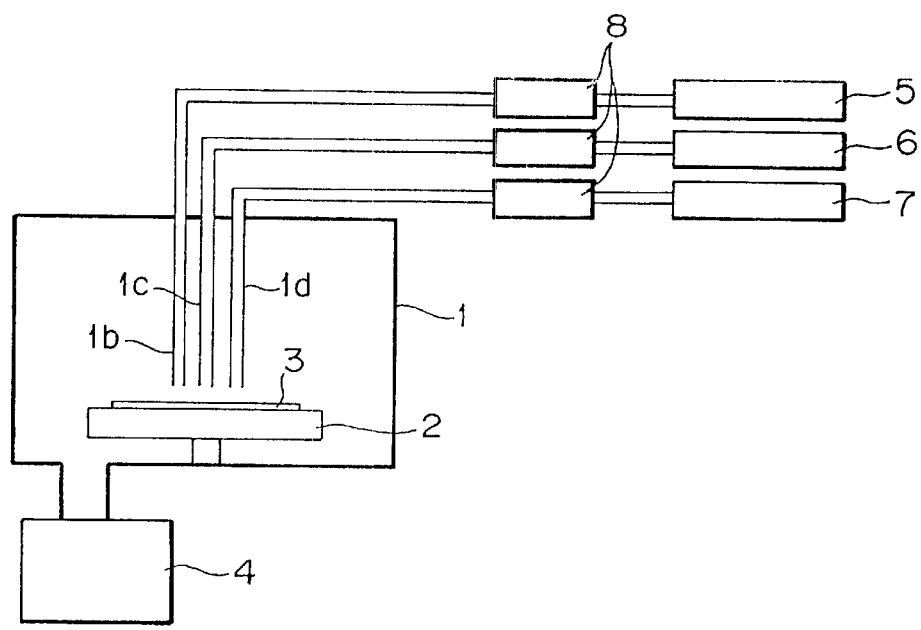
FIG. 3 is a typical view showing an apparatus of fabricating a barrier film used in the first embodiment of the present invention.

Detailed description will given especially on a method of forming the $WSi_xN_y$ film 11 as a barrier film shown in FIG. 2B below. FIG. 3 is a typical view showing an apparatus of fabricating a barrier film used in the first embodiment of the present invention. As shown in FIG. 3, a substrate holder 2 is disposed in a CVD chamber. The substrate holder 2 has an enough resistance to be heated by supplying of current. Therefore, the substrate holder 2 is functioning as a heater for heating a substrate which is set on the substrate holder 2. A gas in the CVD chamber 1 is evacuated through a discharge port 1a by a pump 4. Gas supply ports 1b, 1c and 1d are provided to the CVD chamber 1 and the gas supply port 1b is connected with a $WF_6$ gas bomb 5 through a mass flow controller 8. Moreover, the gas supply port 1c is connected with a dichlorosilane gas bomb 21 through a mass flow controller 8 and the gas supply port 1d is connected with an ammonia gas bomb 7 through a mass flow controller 8.

In order to form a barrier film on the substrate with use of the CVD apparatus constructed in such a manner, after a substrate 3 is fixed on the substrate holder 2, the substrate 3 is heated by the substrate holder 2 at 650° C. Then, after the CVD chamber 1 is evacuated by the pump 4, $WF_6$ gas, dichlorosilane gas and ammonia gas are supplied into the CVD chamber 1 at respective flow rates of 15 sccm, 100 sccm and 100 sccm, while the flow rates are controlled by the mass flow controllers 8. Thereby an amorphous $WSi_xN_y$ film (x=1.7, y=0.3) is formed on the inner surface of the through-hole 32a on the substrate 3.

In the example, when a pressure in the CVD chamber 1 was set at 50 Pa during formation of a $WSi_xN_y$ film, a depositing rate on the substrate 3 was 100 nm/min.

In a semiconductor device fabricated in such a manner, a coverability of a $WSi_xN_y$ film 11 was measured. Furthermore, junction leakage current characteristics and changes in the contact resistance after heat treatments at various temperatures were measured. Moreover, as for a comparative example, a coverability and a contact resistance when a $WN_x$ film was formed by means of a conventional plasma CVD were also measured, wherein a coverability is calculated using the following equation: coverability={(a thickness of a barrier film formed on the bottom surface of a through-hole/a thickness of a barrier film formed on the top surface of an oxide film)×100}.

Figure 4:
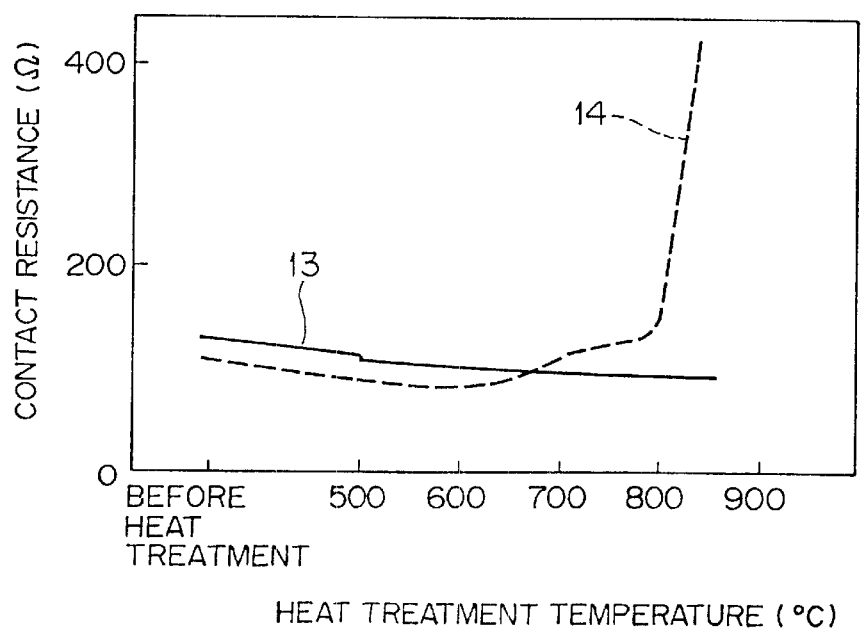
FIG. 4 is a graph showing a relation between the contact resistance after a heat treatment and the heat treatment temperature, wherein an abscissa represents plotted values of the heat treatment temperature, while an ordinate represents plotted values of the contact resistance after the heat treatment at various temperatures.

As a result, while a coverability of a barrier film ($WSi_xN_y$ film) in the example was 70%, a coverability of a barrier film ($WN_x$ film) was 40% in the comparative example. FIG. 4 is a graph showing a relation between the contact resistance after heat treatment and the heat treatment temperature, wherein an abscissa represents plotted values of the heat treatment temperature, while an ordinate represents plotted values of the contact resistance after the heat treatment at various temperatures. In FIG. 4, a broken line 14 is a comparative example showing the resistance of a barrier film ($WN_x$ film) deposited by means of plasma CVD with use of $WF_6$ gas and nitrogen gas. A solid line 13 shows the resistance of a barrier film ($WSi_xN_y$ film) formed by means of the first embodiment of the present invention. As shown in FIG. 4, in the barrier film ($WN_x$ film) of the comparative example, a contact resistance was increased at a temperature of 800° C. or higher in a heat treatment. What's worse, when a temperature in a heat treatment was 850° C., not only was a contact resistance rapidly increased, but leakage current characteristics were also deteriorated.

On the other hand, in a barrier film ($WSi_xN_y$ film) fabricated by means of the first embodiment of the present invention, a contact resistance was not increased even at 850° C. in a heat treatment and no changes in the leakage current characteristics were observed, either.

When the barrier film ($WSi_xN_y$ film) in the first embodiment which had received a heat treatment at 850° C. was subjected to X-ray diffraction analysis it was found that the amorphous structure is maintained. On the other hand, the barrier film ($WN_x$ film) was crystallized at 700° C. and a peak of W was observed at 850° C., which proved that decomposition in the film had been started.

As described above, according to the present invention, since a $WSi_xN_y$ film is deposited as a barrier film, crystallization is disturbed due to the presence of Si in contrast to the conventional $WN_x$ film. The amorphous state is stable even at a higher temperature range of 700 ° C. or higher because of such a disturbance and thus a performance as a barrier is improved, since a diffusion path is not formed. Thereby, a semiconductor device having excellent performance can be obtained.

In the first embodiment mentioned above, while $WF_6$ gas is used as a gas containing W, the gas containing W is not limited to $WF_6$ gas in the present invention, but for example, $W(N(CH_3)_2)_6$, $W(N(C_2H_5)_2)_6$ and the like may be used instead. In the first embodiment, while dichlorosilane gas is used, silane gas maybe used instead in the present invention and a hydrocarbon gas, such as methane gas, ethane gas, propane gas or the like may further be used instead. Moreover, in the first embodiment, while ammonia gas ($NH_3$ gas) is used, at least one kind of the group consisting of nitrogen supply sources, such as a nitriding plasma, a $NH_3$ plasma, nitrogen gas, hydrazine, dimethyl hydrazine and the like can be used instead.

Furthermore, a thin film made of $WSi_xN_y$ may be deposited on a substrate in a reaction of $W(N(CH_3))_6$ or $W(N(C_2H_5))_6$ used as a gas containing W with $SiH_4$ or $CH_4$. Since this method employs a condition in the range of a surface rate determining process, under which gases, such as $SiH_4$ or $CH_4$ is forced to cause a reaction on the surface of a substrate, a reaction in a gas phase which deteriorates a coverability can be suppressed. Therefore, the method in which $W(N(CH_3))_6$ or $W(N(C_2H_5))_6$ is used together with $SiH_4$ gas or $CH_4$ gas can improve a coverability and a $WSi_xN_y$ film can be deposited in an amorphous phase, in contrast with the conventional method in which a $WN_x$ film formed in a vapor phase reaction is deposited on a substrate.

Figure 5A:
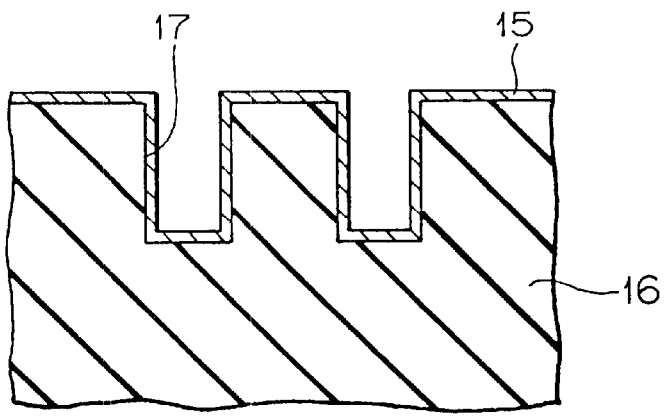
FIGS. 5A to 5C are cross-sectional views showing a method of fabricating a semiconductor device according to a second embodiment of the present invention in successive process steps.
Figure 5B:
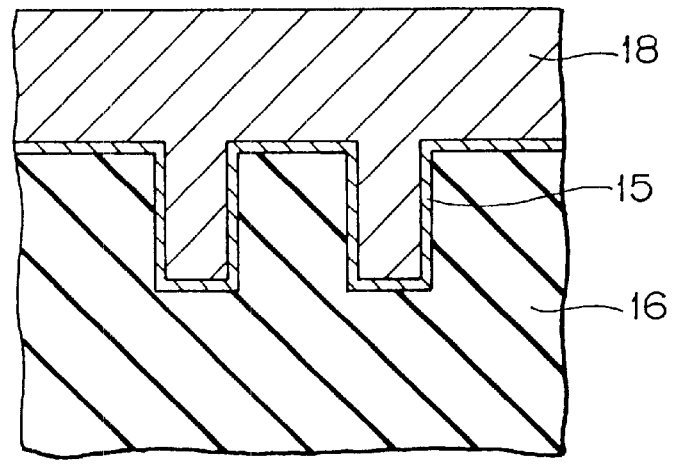
Figure 5C:
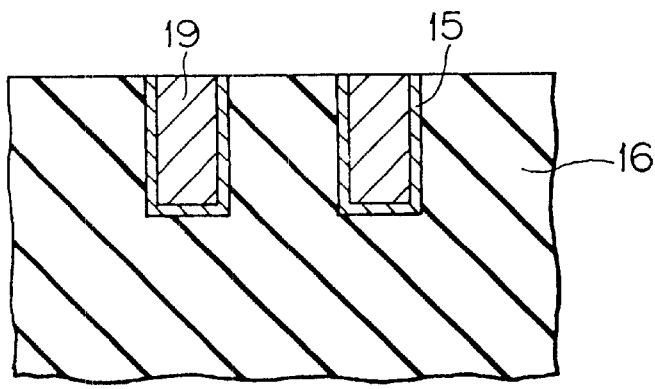

Next, the second embodiment of the present invention will be described. FIGS. 5A to 5C are cross-sectional views showing a method of fabricating a semiconductor device according to a second embodiment of the present invention in successive process steps. As shown in FIG. 5A, a trench 17 having a width of 0.3 μm and a depth of 0.5 μm is selectively formed at the surface of an oxide film 16. A $WC_xN_y$ film 15 as a barrier film is deposited on the top surface of the oxide film 16 and the inner surface of the trench 17. A thickness of the $WC_xN_y$ film 15 formed on the bottom surface of the trench 17 is, for example, 20 nm.

As shown in FIG. 5B, a Cu film 18 is deposited inside of the trench 17 and on the $WC_6N_Y$ film 15 by a CVD method.

Thereafter, as shown in FIG. 5C, the top surface of the Cu film 18 is subjected to a chemical-mechanical polishing to be removed till the top surface of the oxide film 16 is exposed by removing all the Cu film 18 on the oxide film 16 while the Cu film 18 is only left inside the trench 17 and thereby a Cu trench interconnect 19 is obtained.

A method of forming a $WC_xN_y$ film 15 as a barrier film shown in FIG. 5A will below be described in a detailed manner. As for an apparatus of fabricating a film, the same apparatus as that used in the first embodiment was used. In the embodiment, gas supply ports 1b, 1c and 1d are respectively connected to a $WF_6$ gas bomb, a methane gas bomb and an ammonia gas bomb through respective mass flow controllers 8.

With use of the CVD apparatus constructed in such a manner, when a barrier film is formed on a substrate, after the substrate 3 is fixed on a substrate holder 2 disposed in a CVD chamber 1, the substrate 3 is heated to 600° C. by the substrate holder 2. After the CVD chamber 1 is evacuated by a pump 4, $WF_6$ gas, methane gas and ammonia gas are supplied to the CVD chamber 1 at respective flow rates of 1.2 sccm, 80 sccm and 100 sccm, while the flow rates are controlled by the mass flow controllers 8. Thereby, a $WC_xN_y$ film (x=1.8, y=0.2) 15 of an amorphous phase is formed on the inner surface of the trench 17 formed in the oxide film on the substrate.

In the embodiment, when a pressure in the CVD chamber 1 during formation of the $WC_xN_y$ film 15 was set at 40 Pa, a depositing rate of the film on the substrate 3 was 70 nm/min.

A coverability was measured on the $WC_xN_y$ film 15 in the semiconductor device fabricated in such a manner and moreover, an interconnect resistance and a leakage current between interconnects after heat treatments at various temperatures were also measured. As for a comparative example, a coverability, an interconnect resistance and a leakage current between interconnects were also measured in the case where a $WN_x$ film is fabricated by means of a conventional plasma CVD method.

Figure 6:
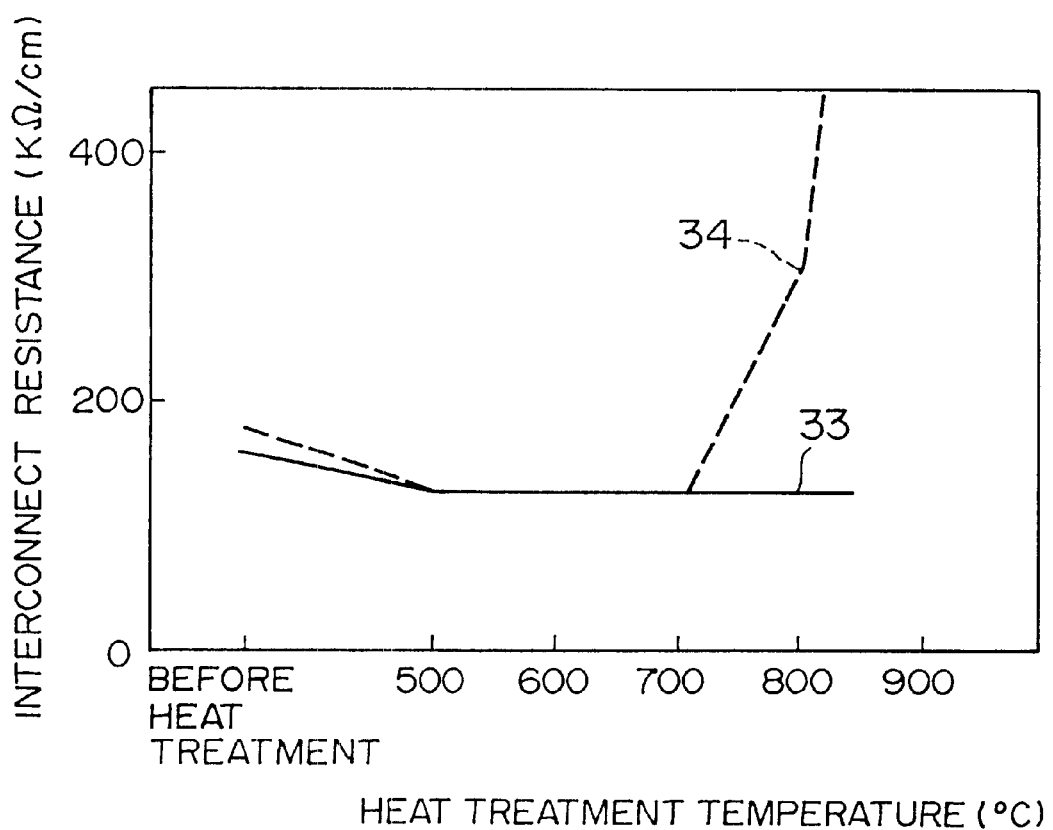
FIG. 6 is a graph showing a relation between the interconnect resistance after a heat treatment and the heat treatment temperature, wherein an abscissa represents plotted values of the heat treatment temperature, while an ordinate represents plotted values of the interconnect resistance after the heat treatment at various temperatures.

As a result, a coverability of a barrier film ($WC_xN_y$ film) formed by means of the second embodiment was 80%, whereas a coverability of a barrier film ($WN_x$ film) of the comparative example was 60%. FIG. 6 is a graph showing a relation between the interconnect resistance after a heat treatment and the heat treatment temperature, wherein an abscissa represents plotted values of the heat treatment temperature, while an ordinate represents plotted values of the interconnect resistance after the heat treatment at various temperatures. In FIG. 6, a broken line 34 is a comparative example showing interconnect resistances when a barrier film ($WN_x$ film) was fabricated by means of plasma CVD using $WF_6$ gas and nitrogen gas. A solid line 33 shows interconnect resistances when a barrier film ($WC_xN_y$ film) fabricated by means of the method according to the second embodiment of the present invention. As shown in FIG. 6, in the comparative example, when a heat treatment temperature is 800° C. or higher, an interconnect resistance was increased and when a heat treatment temperature was set at 850° C., not only was an interconnect resistance rapidly increased, but leakage current characteristics were also deteriorated.

On the other hand, when a barrier film ($WC_xN_y$ film) was fabricated by means of the method of the second embodiment, an interconnect resistance does not increase and leakage current characteristics do not change, even at a heat treatment temperature of 850° C. An X-ray diffraction analysis showed that a barrier film ($WC_xN_y$ film) after a heat treatment at 850° C. kept its amorphous structure as it had been.

As mentioned above, in the second embodiment, since a $WC_xN_y$ film is deposited as a barrier film, crystallization is disturbed by the presence of C in contrast with a conventional $WN_x$ film, so that an original amorphous state is stable even in a temperature range equal to 700° C. or higher and a property as a barrier is improved due to non-existence of diffusion paths. Thereby, a semiconductor device with excellent performance can be obtained.

In the second embodiment mentioned above, while $WF_6$ gas is used as a gas containing W, the gas containing W is not limited to $WF_6$ gas in the present invention, but for example, $W(N(CH_3)_2)_6$, $W(N(C_2H_5)_2)_6$ and the like may be used instead. In the second embodiment, while methane gas is used, a hydrocarbon gas, such as ethane gas, propane gas or the like maybe used instead in the present invention and silane gas or dichlorosilane gas may further be used instead. Moreover, in the second embodiment, while ammonia gas ($NH_3$ gas) is used, at least one kind of the group consisting of nitrogen supply sources, such as a nitriding plasma, a $NH_3$ plasma, nitrogen gas, hydrazine, dimethyl hydrazine and the like can be used instead.

Furthermore, a thin film made of $WC_xN_y$ may be deposited on a substrate in a reaction of $W(N(CH_3))_6$ or $W(N(C_2H_5))_6$ with $SiH_4$ gas or $CH_4$ gas. Since this method employs a condition in the range of a surface rate determining process, under which gases, such as SiH$_4$ or CH$_4$ is forced to cause a reaction on the surface of a substrate, a reaction in a gas phase which deteriorates a coverability can be suppressed. Therefore, the method in which W(N(CH$_3$))$_6$ or W(N(C$_2$H$_5$))$_6$ is used together with SiH$_4$ or CH$_4$ can improve a coverability and a WC$_x$N$_y$ film can be deposited in an amorphous phase, in contrast with the conventional method in which a WN$_x$ film formed in a vapor phase reaction is deposited on a substrate.

Figure 7:
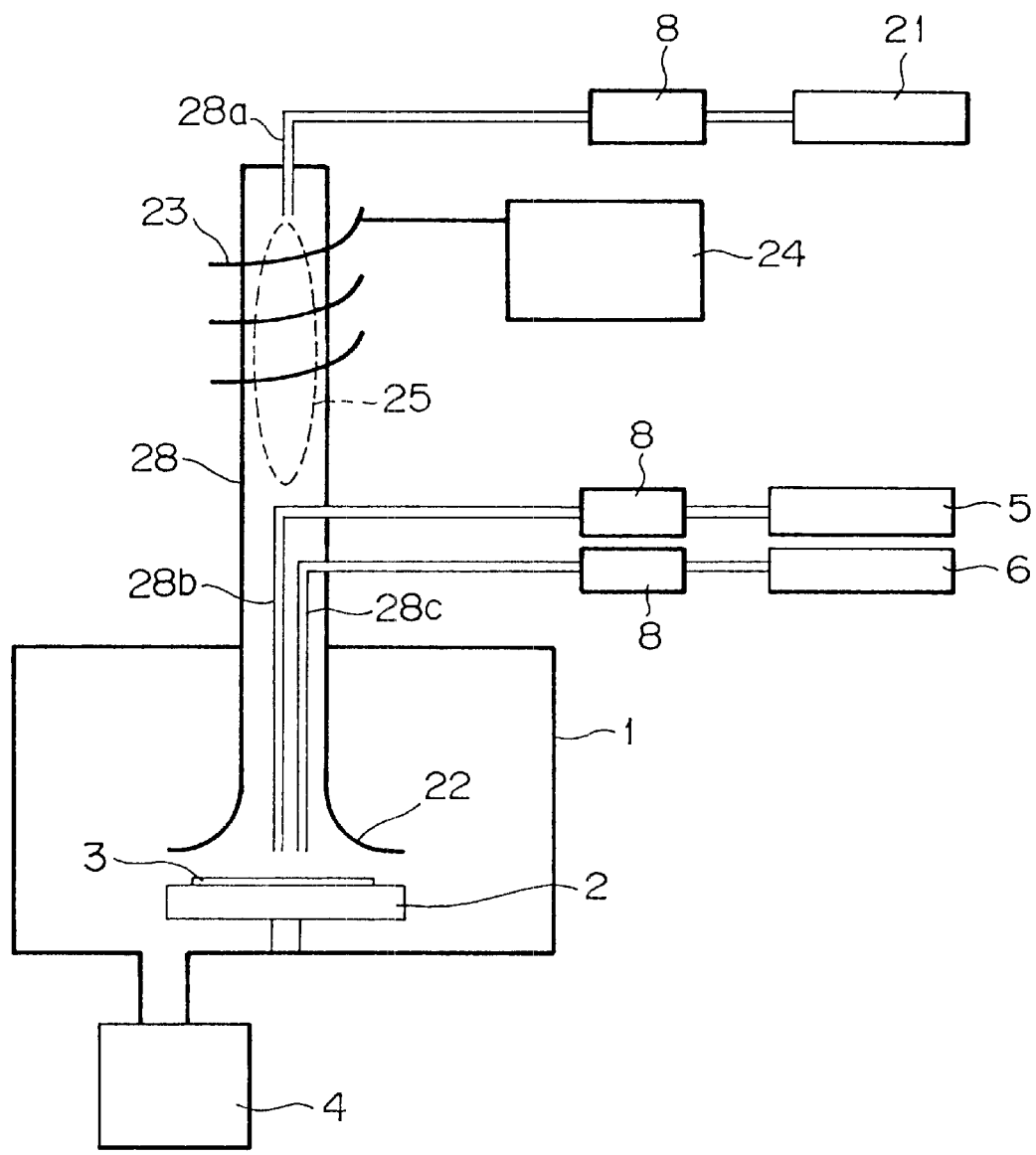
FIG. 7 is a typical view showing an apparatus of fabricating a barrier film used in a third embodiment of the present invention.

The third embodiment of the present invention will be described. FIG. 7 is the typical view showing an apparatus of fabricating a barrier film used in a third embodiment of the present invention. In FIG. 7, the same part as that shown in FIG. 3 is indicated at the same reference mark as that in FIG. 3 and detailed description on the same part as that in FIG. 3 is omitted. As shown in FIG. 7, a plasma producer 28 is disposed above a substrate holder 2 in a CVD chamber 1. A helical resonator 23 is wound around the plasma producer 28 at a distance remote from a substrate holder 2 and the helical resonator 23 is connected with an oscillator 24. The plasma producer 28 is equipped with gas supply ports 28a, 28b and 28c and the gas supply ports are respectively connected with a nitrogen gas bomb 21, a WF$_6$ gas bomb 5 and a dichlorosilane gas bomb 6 by way of gas flow controllers 8. A plasma blowing portion 22 of the plasma producer 28 has a shape whose cross-sectional area is enlarging toward the substrate holder 2 and the gas supply ports 28b and 28c extend down to the fore end of the plasma blowing portion 22. In the mean time, a variety of a gas supply port in shape can be used.

When a barrier film is fabricated on the substrate with use of the CVD apparatus constructed in such a manner, after the substrate 3 is fixed on the substrate holder 2, the substrate 3 is heated by the substrate holder 3. After the CVD chamber 1 is evacuated by the pump 4, a alternating voltage is applied to the helical resonator 23 at a variable frequency from the oscillator 24 and thereby supplied nitrogen 21 is excited to produce a nitrogen plasma 25. A pressure in the plasma blowing portion 22 is set at a higher value than that in the CVD chamber 1 and the produced nitrogen plasma 25 is blown on the substrate 3 by a pressure difference. Thereby, reactive species reach the surface of the substrate 3. The other process steps are the same as those in FIG. 3.

While in a common plasma CVD, active species react still in a vapor phase to produce deposits, in the third embodiment, a plasma, which is a nitrogen supply source, is produced in a remote place from a position where deposition takes place and active species are brought to the surface of the substrate 3. Therefore, in this embodiment, the active species reach the substrate 3 before a reaction takes place among the active species, and the reaction takes place on the surface of the substrate or in the vicinity thereof, so that a coverability of a barrier film can be improved.

When a pressure in the CVD chamber 1 was set at 10 Pa, a pressure in the plasma blowing portion 22 was set at 100 Pa, flow rates of WF$_6$ gas, silane gas and nitrogen gas were respectively set at 1 sccm, 50 sccm and 100 sccm, and a temperature of the substrate was 400° C., a film formation rate was at 20 nm/min. A coverability of a barrier film showed 70% for an interconnect trench having a width of 0.3 μm and a depth of 0.5 μm. This coverability is a value improved by 10%, compared with coverability in a conventional CVD. An analysis was conducted on a deposited film according to the method used in the third embodiment showed that a composition was WSi$_x$N$_y$ (x=1.7, y=0.3) and a structure was amorphous.

In the third embodiment, though dichlorosilane gas is use as a reaction gas, silane may be used. Instead of nitrogen gas, ammonia plasma, which is more active than the nitrogen plasma, can be used. When ammonia, hydrazine or methyl hydrazine is used, a film can be fabricated without production of plasma since they are very reactive.

A WC$_x$N$_y$ film can be deposited by use of a hydrocarbon gas, such as methane gas, ethane gas or the like instead of silane or dichlorosilane. When plasma is used, a temperature of a substrate can be lowered, too.

A thin film made of WSi$_x$N$_y$ can also be deposited on a substrate by a reaction of SiH$_4$ gas or CH$_4$ gas with W(N(CH$_3$))$_6$ or W(N(C$_2$H$_5$))$_6$ as a gas containing W.

What is claimed is:

1. A method of fabricating a semiconductor device comprising the steps of:

providing a semiconductor substrate;

forming an insulating film on said semiconductor substrate;

forming a trench in said insulating film; and forming and depositing on an inner surface of said trench an amorphous phase barrier film made of a material selected from the group consisting of WSi$_x$N$_y$ and WC$_x$N$_y$ by reacting a raw material gas containing W, a gas selected from the group consisting of silane gas, dichlorosilane gas and a hydrocarbon gas, and a nitrogen supply source.

2. A method of fabricating a semiconductor device according to claim 1, wherein said nitrogen supply source is one kind selected from the group consisting of a nitriding plasma, a NH$_3$ plasma, nitrogen gas, NH$_3$ gas, hydrazine and dimethyl hydrazine.

3. A method of fabricating a semiconductor device according to claim 1, wherein said hydrocarbon gas is a gas of one kind selected from the group consisting of methane gas, ethane gas and propane gas.

4. A method of fabricating a semiconductor device according to claim 1, wherein said raw material gas containing W is a gas of one kind selected from the group consisting of WF$_6$ gas, W(N(CH$_3$)$_2$)$_6$ and W(N(C$_2$H$_5$)$_2$)$_6$.

5. A method of fabricating a semiconductor device according to claim 1, further comprising the step of:

filling a conductive material in said trench after said step of forming said barrier film on said inner surface of said trench.

6. A method of fabricating a semiconductor device according to claim 1, wherein said nitrogen supply source is a plasma of one kind selected from the group consisting a nitrogen plasma and an ammonia plasma and the step of forming said barrier film comprises the steps of producing said nitrogen supply source and supplying said nitrogen supply source to the surface of said substrate.

7. A method of fabricating a semiconductor device, comprising the steps of:

providing a semiconductor substrate;

forming an insulating film on said semiconductor substrate;

forming a trench in said insulating film;

causing a reaction between a raw material gas selected from the group consisting of $W(N(CH_3)_2)_6$ and $W(N(C_2H_5)_2)_6$ and a gas selected from the group consisting of $SiH_4$ and $CH_4$ to form and deposit on an inner surface of said trench an amorphous phase barrier film made of a material selected from the group of $WSi_xN_y$ and $WC_xN_y$ on a semiconductor substrate.

8. A method of fabricating a semiconductor device comprising the steps of:

providing a semiconductor substrate having an insulating film formed thereon;

forming a trench in said insulating film; and reacting a raw material gas containing W, a gas selected from the group consisting of silane gas, dichlorosilane gas and a hydrocarbon gas, and a nitrogen supply source to form and deposit, on an inner surface of said trench an amorphous barrier film made of a material selected the group consisting of $WSi_xN_y$ and $WC_xN_y$.

9. A method of fabricating a semiconductor device according to claim 8, wherein said nitrogen supply source is selected from the group consisting of a nitriding plasma, a $NH_3$ plasma, nitrogen gas, $NH_3$ gas, hydrazine and dimethyl hydrazine.

10. A method of fabricating a semiconductor device according to claim 8, wherein said hydrocarbon gas is a gas selected from the group consisting of methane gas, ethane gas and propane gas.

11. A method of fabricating a semiconductor device according to claim 8, wherein said raw material gas containing W is a gas selected from the group consisting of $WF_6$ gas, $W(N(CH_3)_2)_6$ and $W(N(C_2H_5)_2)_6$.

12. A method of fabricating a semiconductor device according to claim 8, further comprising the step of:

filling a conductive material in said trench after said step of forming said barrier film on said inner surface of said trench.

13. A method of fabricating a semiconductor device according to claim 8, wherein said nitrogen supply source is a plasma selected from the group consisting of a nitrogen plasma and an ammonia plasma and the step of forming said barrier film comprises the steps of producing said nitrogen supply source and supplying said nitrogen supply source to the surface of said substrate.

14. A method of fabricating a semiconductor device, comprising the steps of:

providing a semiconductor substrate having an insulating film formed thereon;

forming a trench in said insulating film; and reacting a raw material gas selected from the group consisting of $W(N(CH_3)_2)_6$ and $W(N(C_2H_5)_2)_6$ and a gas selected from the group consisting of $SiH_4$ and $CH_4$ to form a on an inner surface of said trench an amorphous phase barrier film made of material selected from the group of $WSi_xN_y$ and $WC_xN_y$ on a semiconductor substrate.

* * * * *

UNITED STATES PATENT AND TRADEMARK OFFICE
CERTIFICATE OF CORRECTION

PATENT NO. : 6,472,318 B2
DATED : October 29, 2002
INVENTOR(S) : Ueno

It is certified that error appears in the above-identified patent and that said Letters Patent is hereby corrected as shown below:

Column 11,
Line 22, please insert -- from -- after "selected".

Column 12,
Line 25, "a" should be -- and deposit --.

Signed and Sealed this

Twenty-seventh Day of April, 2004

JON W. DUDAS
*Acting Director of the United States Patent and Trademark Office*